(12) United States Patent
Spryshak

(10) Patent No.: US 6,920,046 B2
(45) Date of Patent: Jul. 19, 2005

(54) DISSIPATING HEAT IN AN ARRAY OF CIRCUIT COMPONENTS

(75) Inventor: Joseph J. Spryshak, Hartland, MI (US)

(73) Assignee: Eaton Corporation, Cleveland, OH (US)

( * ) Notice: Subject to any disclaimer, the term of this patent is extended or adjusted under 35 U.S.C. 154(b) by 203 days.

(21) Appl. No.: 10/603,519

(22) Filed: Jun. 25, 2003

(65) Prior Publication Data

US 2004/0264141 A1 Dec. 30, 2004

(51) Int. Cl.$^7$ ................................................ H05K 7/20
(52) U.S. Cl. ...................... 361/704; 165/80.3; 165/185; 361/707; 361/708; 361/719; 361/720; 362/294; 362/218; 362/373
(58) Field of Search ............................... 165/80.3, 185; 361/704–710, 719–720; 362/218, 294, 373, 800

(56) References Cited

U.S. PATENT DOCUMENTS

| | | | |
|---|---|---|---|
| 5,305,185 A | | 4/1994 | Samarov et al. |
| 5,857,767 A | * | 1/1999 | Hochstein ............... 362/294 |
| 5,986,884 A | | 11/1999 | Jairazbhoy et al. |
| 6,025,992 A | | 2/2000 | Dodge et al. |
| 6,045,240 A | * | 4/2000 | Hochstein ............... 362/294 |
| 6,190,941 B1 | | 2/2001 | Heinz et al. |
| 6,428,189 B1 | * | 8/2002 | Hochstein ............... 362/373 |
| 6,480,389 B1 | * | 11/2002 | Shie et al. ............... 361/707 |
| 6,517,218 B2 | * | 2/2003 | Hochstein ............... 362/294 |
| 6,860,620 B2 | * | 3/2005 | Kuan et al. ............... 362/294 |

FOREIGN PATENT DOCUMENTS

| EP | 1 094 697 A2 | 4/2001 |
|---|---|---|
| JP | 57 105684 | 7/2002 |

* cited by examiner

Primary Examiner—Gregory Thompson
(74) Attorney, Agent, or Firm—Roger A. Johnston

(57) ABSTRACT

A circuit board assembly with an array of closely spaced circuit components mounted thereon. The board has a pattern of conductive strips on both front and back faces and the strips are connected through the board by thermally conductive vias. The circuit components are mounted on one side of the board and a layer of thermally conductive, double-sided adhesive tape is laid over the conductive strips on both faces of the board. Heat sinks are then applied against the tape on both sides of the board to conduct heat from the board through the tape.

17 Claims, 3 Drawing Sheets

DISSIPATING HEAT IN AN ARRAY OF CIRCUIT COMPONENTS

BACKGROUND OF THE INVENTION

The present invention relates to electrical components of the type mounted on a circuit board such as, for example, resistors, capacitors, photo detectors and photo emitters such as light emitting diodes (LEDs). These latter devices may be mounted individually or in closely spaced arrangement in an array where relatively high illumination is required in a relatively small area. In such arrays, it has been found difficult to remove the heat at a sufficient rate to prevent the LEDs from overheating and resultant premature failure.

Presently LEDs are limited in further increases in illumination power by the inability to keep the junction temperature within a range that the efficiency and life expectancy of the device is acceptable.

Currently, it has been found desirable to employ LEDs in automotive illumination applications. LEDs are desirable in such applications because of their higher efficiency in terms of light intensity output as a function of the electrical energy input as compared with incandescent bulbs. However, LEDs have the disadvantage that they have a much lower operating temperature limit than incandescent bulbs. In such automotive applications the environment in which the LEDs must operate subjects them to ambient temperatures higher than typically encountered in indoor stationary applications.

In applications where the LEDs are arranged in closely spaced arrays, it has been desired to find a way or means of economically removing the heat from the diode array in order to prevent exceeding the operating temperature of the individual LEDs. This latter problem is particularly troublesome where the LEDs are mounted directly on a circuit board for economies of space and ease of manufacture. This has been desired to find a way or means of providing increased cooling for an array of closely spaced circuit components, particularly LEDs mounted directly on a circuit board.

BRIEF SUMMARY OF THE INVENTION

It is an object of the present invention to provide an improved technique for removing heat from an array of electrical circuit components such as LEDs mounted directly on a circuit board.

The present invention provides a solution to the above-described problem of removing heat from circuit components mounted on a circuit board and particularly solves the problem of removing heat from a closely spaced array of circuit components mounted directly on a circuit board and more particularly LEDs in a manner which is easy to manufacture and relatively low in cost for high volume production.

The technique of the present invention employs conductive strips arranged in a pattern on the front and back face of the circuit board with the LEDs mounted in an array on one side of the board and connected to the conductive strips on the front and back sides of the board. Additional thermally conductive vias pass through the board to conduct heat between the front and back layers of conductive strips. The circuit components are connected to the strips and thermally conductive tape is applied over the pattern of conductive strip on the front and back of the board; and, heat sinks are disposed in direct contact with the surface of the tape for conducting heat from the conductive strips through the thermally conductive tape on the front and back faces of the board and outwardly through the heat sinks. Thus, heat is conducted through the conductive strips and the thermally conductive tape to the heat sink on both the front and back sides of the board from an array of circuit components, particularly LEDs mounted on only one side of the board.

DETAILED DESCRIPTION OF THE INVENTION

Figure 1:
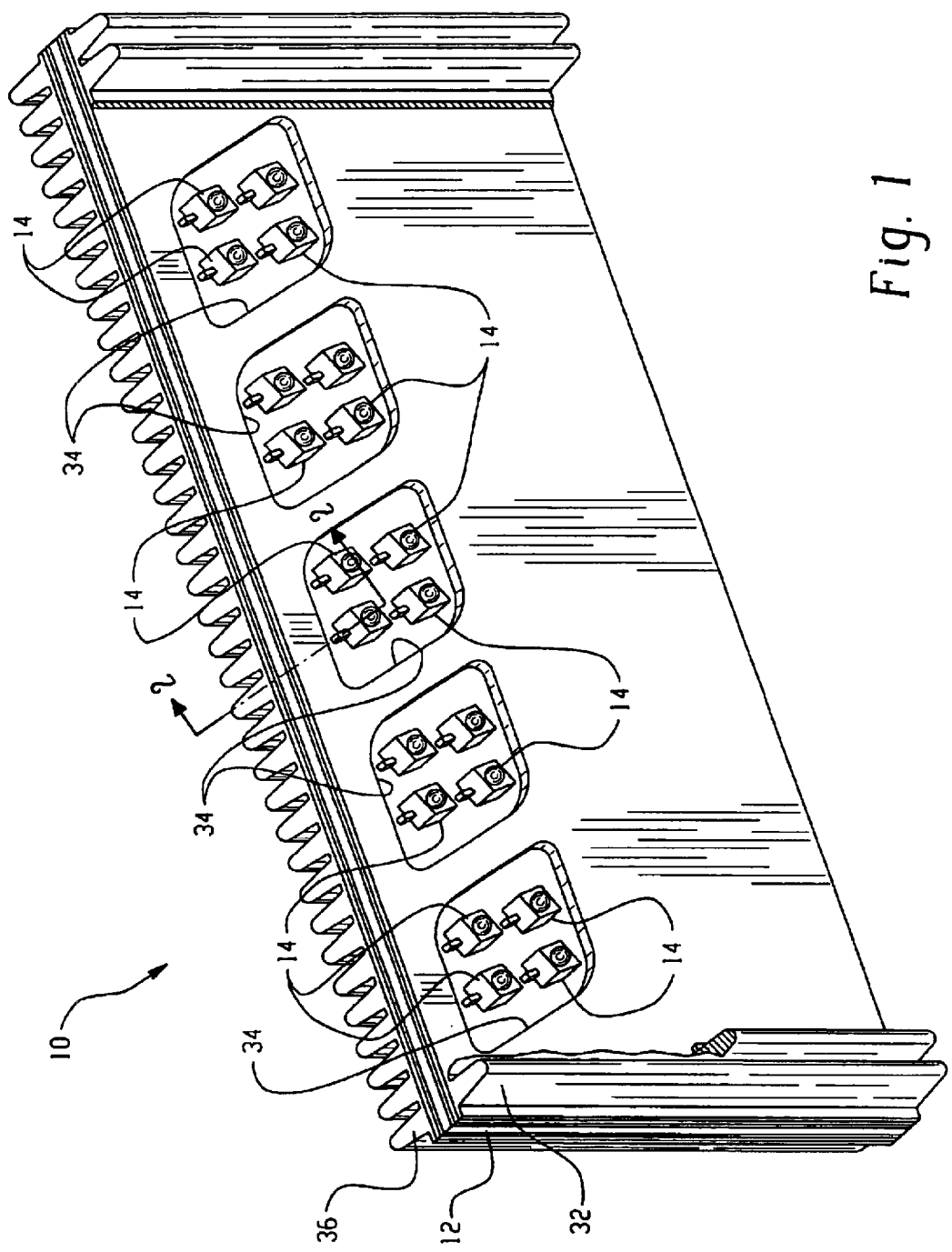
FIG. 1 is a perspective view of the circuit board assembly of the present invention.

The present invention may be embodied in an assembly indicated generally at 10 in FIG. 1 and includes a circuit board 12 having a plurality of circuit components such as LEDs 14 mounted thereon in relatively closely spaced array and preferably staggered arrangement on the front face of the board. Although the circuit components are shown in the illustrated embodiment as mounted in an array on one face of the board, it will be understood that alternatively the circuit components may be mounted on both the front and back faces. The front and back faces of the board each have disposed thereon a plurality of conductive strips arranged in a pattern with the strips denoted by reference numerals 16, 18 in FIG. 2. The strips may be interconnected by a plurality of thermally conductive vias 20 preferably in the form of hollow rivets to conduct heat from the strips on one side of the board through the board to the strips on opposite side or face of the board. Optionally, the vias 20 may be additionally filled with thermally conductive material such as copper to improve the thermal conductivity thereof.

Figure 2:
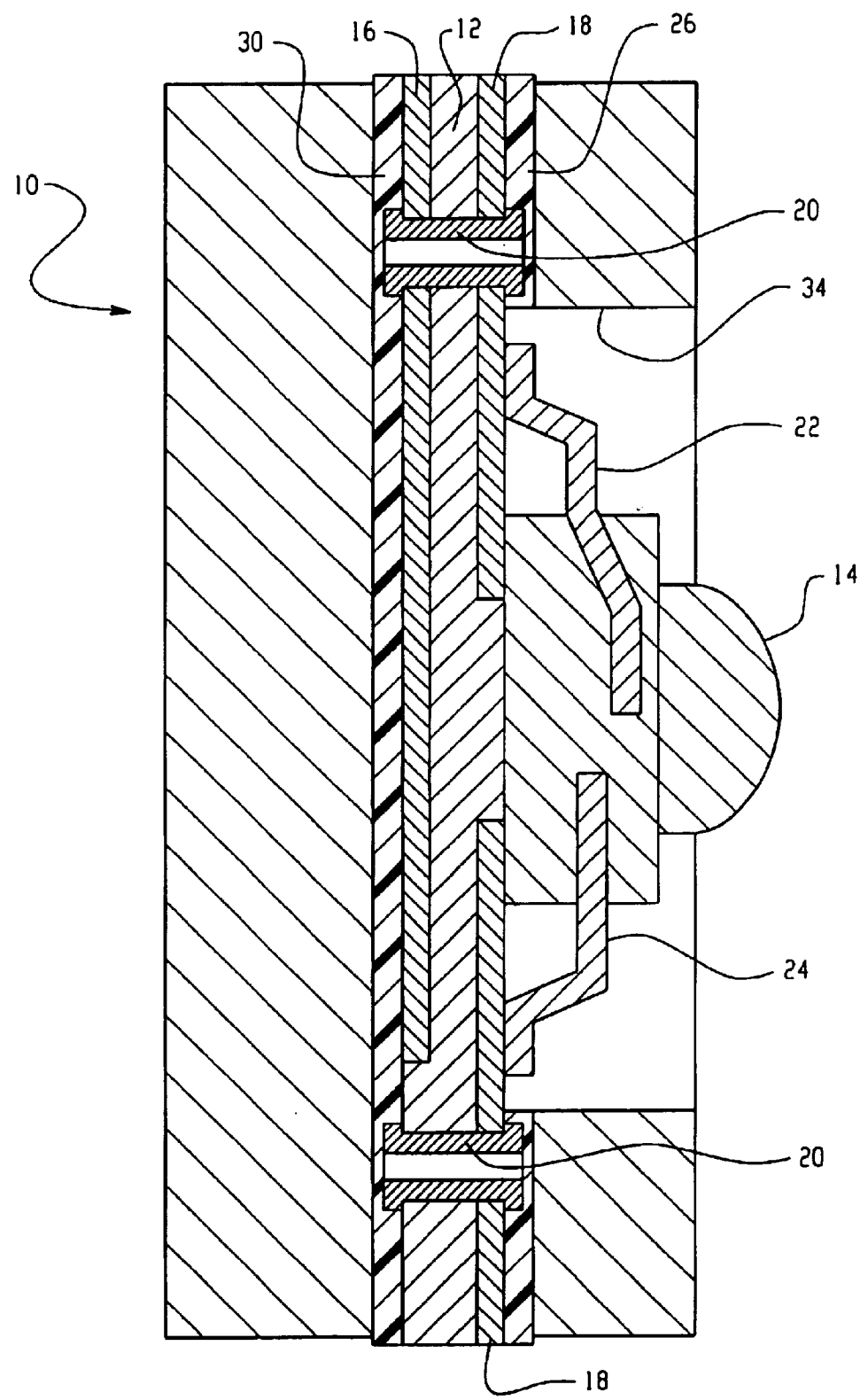
FIG. 2 is a section view taken along section indicating lines 2—2 of FIG. 1; and, FIG. 3 is an enlarged perspective view of a portion of FIG. 2.
Figure 3:
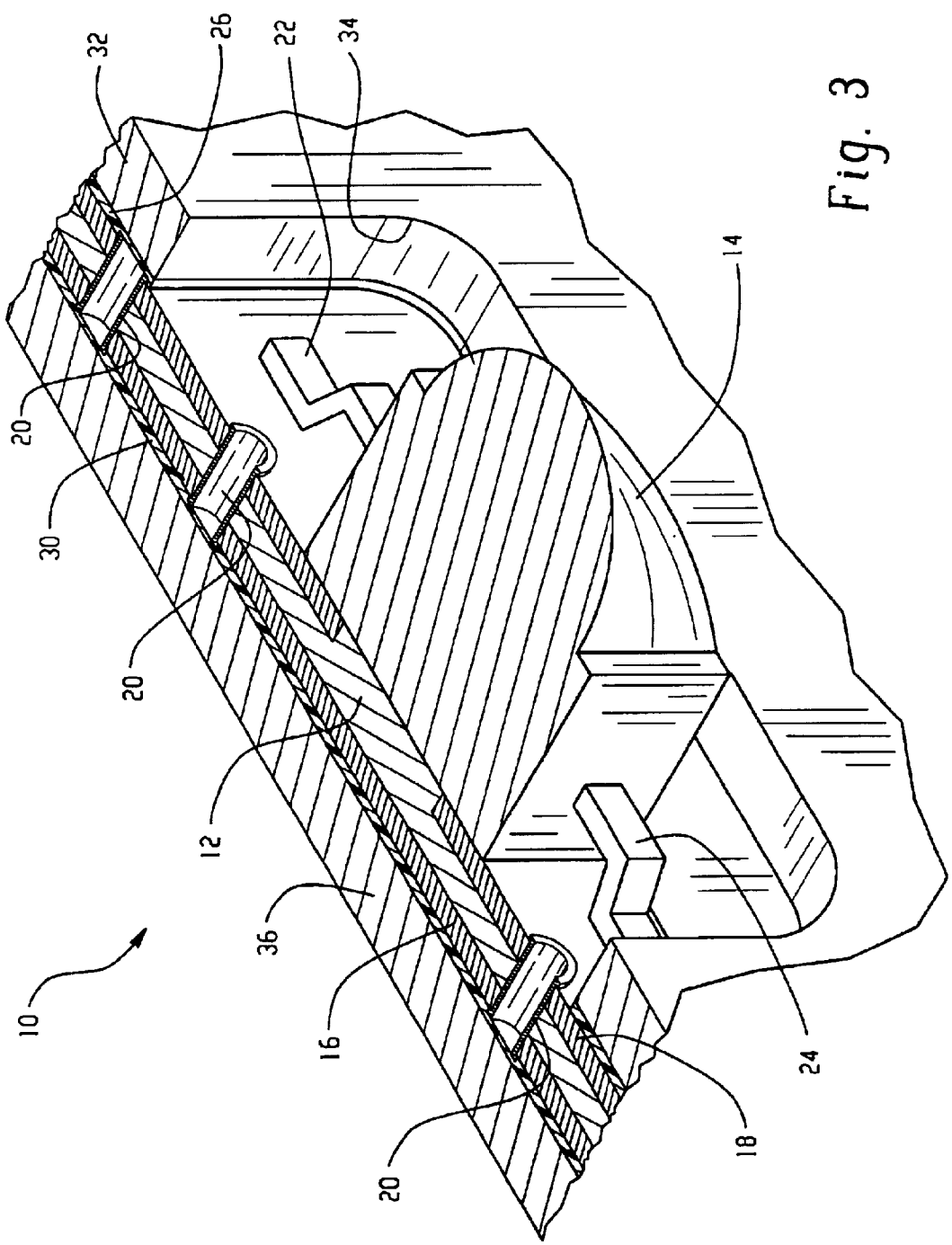

Referring to FIGS. 2 and 3, each of the LEDs 14 has a pair of electrical leads 22, 24 respectively which are attached to individual separate strips of the pattern of strips 18 on the front face of the board by electrically conductive leads 22, 24. In the present practice of the invention the leads 22, 24 are attached to the strips 18 by soldering, but other suitable expedients, as for example, resistance or laser weldment may be employed.

As shown in FIG. 1, the LEDs are preferably arranged in a staggered array with the board disposed in the vertical position shown in FIG. 1 in order to minimize an accumulation of the heat from lower adjacent diodes by upwardly convective air currents passing through the diode array.

Referring to FIGS. 2 and 3, a layer of thermally conductive tape 26 is disposed over the front face of the board and has a plurality of cut-outs or voids 28 formed therein to accommodate the diodes; and, similarly a layer of thermally conductive tape 30 is disposed in direct contact with the back face of the board. In the present practice of the invention, it has been found satisfactory to employ thermally conductive electrically non-conductive double-sided adhesive tape for both layers 26, 30; and, the tape has a thermal conductivity of about 0.4 Watts per meter—K as measured per ASTMD5470. In the presently preferred practice of the invention the tape is formed of polymeric film material coated with thermally conductive acrylic adhesive on opposite sides of the tape; and, the tape has a thickness of about 0.18 mm. One commercially available tape which has been found satisfactory is available from the Bergquist Company, 1893 West 18th Street, Chanhassen, Minn. 55317, bearing manufacturer's identification 660; however, any suitable thermally conductive tape may be employed.

Referring to FIGS. 1 through 3, the front face of the board has a heat sink 32 disposed directly against the thermally conductive tape 26; and, the heat sink 32 has a plurality of voids or cut-outs 34 formed therein to provide clearance for the diode array. Optionally, the heat sink 32 may be finned for improved convective cooling. Preferably, the cutouts and the pattern of the LEDs are such that the LEDs are equidistant from the edge of the heat sink to minimize "hotspots".

A heat sink 36 is disposed in direct contact with the layer of tape 30 on the back face of the circuit board; and, the heat sink 36 may also be vertically finned as shown in FIG. 1. Thus, the thermally conductive tape layers 26, 30 are effective to conduct heat from the conductive strips 16, 18 outwardly from the board and thereby provide a direct path for conducting heat away from the diodes through the board.

It will be understood that the construction of the assembly 10 of the present invention provides improved heat transfer from an array of circuitry components on a circuit board in orientations other than the vertical as, for example, when the board is inclined at an angle of about 40 to 45 degrees to the vertical as may be encountered in certain automotive applications. The present invention thus provides a unique and novel assembly of a circuit board with an array of circuitry components thereon and particularly LEDs, which generate substantial amounts of heat during electrical energization and provides for transfer of the heat through the conductive strips of the board to which the LEDs are electrically attached through vias to the strips on the opposite face and effects transfer of the heat through thermally conductive double-sided tape contacting the strips on both faces of the board and to heat sinks disposed against opposite side of the tape on both sides of the board.

Although the invention has hereinabove been described with respect to the illustrated embodiments, it will be understood that the invention is capable of modification and variation and is limited only by the following claims.

What is claimed is:

1. A method of dissipating heat in an array of circuit components comprising:
   (a) providing a circuit board having a front and back face with a pattern of electrically conductive strips having a relatively high coefficient of thermal conductivity disposed on each of the front and back face of the board;
   (b) disposing a plurality of said components in an array on one of the front and back faces of the board and connecting each of said components to the front and/or back pattern of strips;
   (c) applying a layer of tape having a relatively high coefficient of thermal conductivity to each of said front and back faces of the board; and,
   (d) disposing a heat sink in contact with the tape on each of the front and back faces of the board.

2. The method defined in claim 1, wherein said step of disposing circuit components in an array includes disposing a plurality of light emitting diodes (LEDs).

3. The method defined in claim 2, wherein said step of disposing LEDs includes disposing same in equidistant arrangement with respect to said heat sink.

4. The method defined in claim 1, wherein said step of providing a circuit board includes arranging a pattern of electrical leads disposed on the front and back for conducting heat array from each of the circuit components.

5. The method defined in claim 1, wherein said step of providing a circuit board includes providing a relatively thin board formed of flexible material.

6. The method defined in claim 1, wherein said step of disposing a heat sink includes disposing a member having a finned surface.

7. The method defined in claim 1, wherein said step of applying a layer of tape includes applying a tape formed of polymeric film material coated with thermally conductive acrylic adhesive on opposite sides of the tape.

8. The method defined in claim 1, wherein said step of applying a layer of tape includes applying a tape having a thermal conductivity of about 0.4 Watts/meter-K as measured per ASTM D5470.

9. The method defined in claim 1, wherein said step of applying a tape includes applying a double-sided adhesive tape.

10. The method defined in claim 1, wherein said step of disposing a plurality of components includes soldering the leads of the components to said conductive strips.

11. The method defined in claim 1, wherein said step of providing a circuit board includes disposing a plurality of electrically and thermally conductive vias through the board.

12. The method defined in claim 1, wherein the step of disposing a plurality of components includes orienting the board at an angle of about 42° to the vertical.

13. In combination a circuit board with an array of circuit components comprising:
   (a) said circuit board having a front and back face with a pattern of electrically conductive strips having a relatively high coefficient of thermal conductivity disposed on each of the front and back faces of the board;
   (b) a plurality of said components disposed in an array of one of said front and back faces of the board with each of the components electrically connected to the conductive strips on the front and/or back faces;
   (c) a layer of thermally conductive tape disposed over the conductive strips on each of the front and back faces of the board; and,
   (d) a heat sink disposed against said layer of tape on each of said front and back faces of the board.

14. The combination defined in claim 13, wherein said tape is formed of polymeric film coated with thermally conductive acrylic adhesive on opposite sides of the tape.

15. The combination defined in claim 13, wherein said tape has a thermal conductivity of about 0.4 Watts/meter-K as measured per ASTM D5470.

16. The combination defined in claim 13, wherein said tape comprises a double-sided adhesive tape.

17. The combination defined in claim 13, wherein said circuit board includes a plurality of electrically and thermally conductive vias extending from the front face through the board to the back face.

* * * * *